(12) United States Patent
Kwak (10) Patent No.: US 9,871,053 B2
(45) Date of Patent: Jan. 16, 2018

(54) SEMICONDUCTOR DEVICE

(71) Applicant: SK hynix Inc., Gyeonggi-do (KR)

(72) Inventor: Sang Hyon Kwak, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/219,784

(22) Filed: Jul. 26, 2016

(65) Prior Publication Data

US 2017/0271354 A1    Sep. 21, 2017

(30) Foreign Application Priority Data

Mar. 15, 2016  (KR) .................. 10-2016-0030809

(51) Int. Cl.
| | |
|---|---|
| H01L 27/115 | (2017.01) |
| H01L 23/528 | (2006.01) |
| H01L 21/768 | (2006.01) |
| H01L 23/522 | (2006.01) |
| H01L 27/11582 | (2017.01) |
| H01L 27/11556 | (2017.01) |
| H01L 27/11565 | (2017.01) |
| H01L 27/11519 | (2017.01) |

(52) U.S. Cl.
CPC .. *H01L 27/11582* (2013.01); *H01L 21/76805* (2013.01); *H01L 23/528* (2013.01); *H01L 23/5226* (2013.01); *H01L 27/11519* (2013.01); *H01L 27/11556* (2013.01); *H01L 27/11565* (2013.01)

(58) Field of Classification Search
None
See application file for complete search history.

(56) References Cited

U.S. PATENT DOCUMENTS

2014/0042512 A1* 2/2014 Jeon .................... H01L 27/1052
257/314
2014/0191389 A1* 7/2014 Lee ..................... H01L 21/7685
257/734

FOREIGN PATENT DOCUMENTS

KR    1020140052398    5/2014

* cited by examiner

*Primary Examiner* — Whitney T Moore
(74) *Attorney, Agent, or Firm* — IP & T Group LLP (57) ABSTRACT

Provided herein is a semiconductor device. The semiconductor device includes: a lower conductive pattern; a lower memory string conductive pattern disposed over the lower conductive pattern; a stack of upper memory string conductive patterns, wherein the stack is disposed over the lower memory string conductive pattern; a lower pad pattern extending from the lower memory string conductive pattern; upper pad patterns respectively extending from the upper memory string conductive patterns; a floating conductive pattern disposed under below the lower pad pattern, the floating conductive pattern overlapping the lower pad pattern; and a contact plug coming into contact with the lower pad pattern and overlapping the floating conductive pattern.

20 Claims, 10 Drawing Sheets

SEMICONDUCTOR DEVICE

CROSS-REFERENCE TO RELATED APPLICATION

The present application claims priority to Korean patent Application No. 10-2016-0030809, filed on Mar. 15, 2016, which is herein incorporated by reference in its entirety.

BACKGROUND

1. Field

Various embodiments of the present disclosure relate to a semiconductor device, and more particularly, to a semiconductor device including a stacked structure of conductive patterns.

2. Description of Related Art

A semiconductor device may include a memory device capable of storing data. The memory device may include memory cells. For a high integration of the semiconductor device, the memory cells may be arranged in three dimensions. The memory cells arranged in three dimensions may be coupled to conductive patterns that are disposed at different levels. The conductive patterns may form a stepped structure and be stacked on top of one another.

The stepped structure may be formed of one ends of the conductive patterns. The one ends of the conductive patterns that form the stepped structure may be defined as pad regions. The pad regions of the conductive patterns may be coupled to respective contact plugs.

Portions of the conductive patterns may be perforated in the pad regions by the contact plugs. In this case, the contact plug that passes through the conductive pattern in the pad region may cause a bridge failure. For example, the bridge failure may occur when a target conductive pattern among the contact patterns is electrically coupled with a lower conductive pattern disposed below the target conductive pattern. The operational reliability of the semiconductor device may deteriorate due to such a bridge failure.

SUMMARY

One embodiment of the present disclosure provides a semiconductor device including: a lower conductive pattern; a lower memory string conductive pattern disposed over the lower conductive pattern; a stack of upper memory string conductive patterns, wherein the stack is disposed over the lower memory string conductive pattern; a lower pad pattern extending from the lower memory string conductive pattern; upper pad patterns respectively extending from the upper memory string conductive patterns; a floating conductive pattern disposed under below the lower pad pattern, the floating conductive pattern overlapping the lower pad pattern; and a contact plug coming into contact with the lower pad pattern and overlapping the floating conductive pattern.

Another embodiment of the present disclosure provides a semiconductor device including: a pipe gate; a pipe channel layer embedded in the pipe gate; a drain side channel layer and a source side channel layer extending from the pipe channel layer; drain side word lines surrounding the drain side channel layer and stacked on top of one another spaced apart from each other; source side word lines surrounding the source side channel layer and stacked on top of one another spaced apart from each other; pad patterns extending from respective one ends of the drain side word lines or the source side word lines and forming a stepped structure; a floating conductive pattern among the pad patterns, disposed below a first pad pattern that is most adjacent to the pipe gate, the floating conductive pattern overlapping the first pad pattern; and a contact plug contacting the first pad pattern and extending in a direction in which the drain side channel layer and the source side channel layer extend, the contact plug overlapping the floating conductive pattern.

Another embodiment of the present disclosure provides a semiconductor device including: a source line; a channel layer coupled to the source line; a source select line surrounding the channel layer; word lines disposed over the source select line and stacked spaced apart from each other in a direction in which the channel layer extends, the word lines surrounding the channel layer; a first pad pattern extending from one end of the source select line; upper pad patterns extending from respective one ends of the word lines and forming a stepped structure, the upper pad patterns formed such that the first pad pattern is exposed; a floating conductive pattern disposed below the first pad pattern and overlapping the first pad pattern; and a contact plug contacting the first pad pattern and extending in a direction in which the channel layer extends, the contact plug overlapping the floating conductive pattern.

BRIEF DESCRIPTION OF THE DRAWINGS

Example embodiments will now be described more fully hereinafter with reference to the accompanying drawings; however, the examples may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, embodiments of the present disclosure will be described in detail with reference to the attached drawings. The present disclosure is not limited to the following embodiments, and various embodiments are possible. The embodiments are only for illustrative purposes to enable those skilled in this art to easily understand the scope of the present disclosure. The scope of the present disclosure is defined by the accompanying claims.

Embodiments of the present disclosure provide a semiconductor device which has improved operational reliability.

Figure 1:
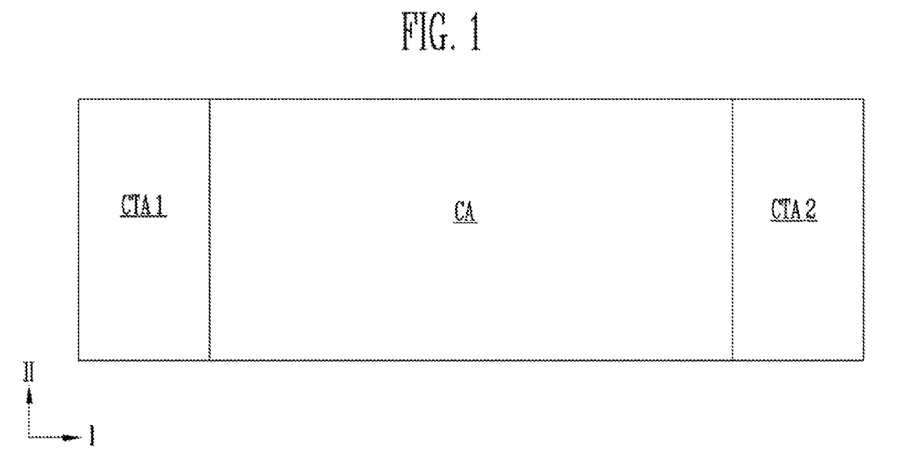
FIG. 1 is a view illustrating a cell region and contact regions of a semiconductor device according to an embodiment of the present disclosure.

FIG. 1 is a view illustrating a cell region and contact regions of a semiconductor device according to an embodiment of the present disclosure. Referring to FIG. 1, the semiconductor device according to the embodiment of the present disclosure may be formed on a substrate that includes a cell region CA and contact regions CTA1 and CTA2 extending from the cell region CA in a first direction I.

A cell array may be disposed on the cell region CA. The cell array may include memory blocks. Each of the memory blocks may include memory cells. Each of the memory cells may store one or more bits. The memory cells may be coupled to each other in series through a channel layer so as to form a memory string. One end of the channel layer may be coupled to a bit line, and the other end of the channel layer may be coupled to a source line. The channel layer may be between memory string conductive patterns that are spaced apart from each other and stacked on the substrate.

The memory string conductive patterns may include word lines coupled to gates of the memory cells, and select lines coupled to gates of select transistors. The select lines may include a drain select line adjacent to the bit line, and a source select line adjacent to the source line. The memory string conductive patterns may extend from over the cell region CA to over the contact regions CTA1 and CTA2 in the first direction I.

The memory string formed on the cell region CA may have various structures. For example, the memory string may be formed in a straight shape, a U shape, a W shape, and so forth. The structure of the memory string will be described in detail below with reference to FIGS. 2A to 2C.

The semiconductor device according to the embodiment of the present disclosure may include pad patterns which extend from the memory string conductive patterns to form a stepped structure in each contact region CTA1, CTA2. The contact regions CTA1 and CTA2 may include a first contact region CTA1 and a second contact region CTA2 which are disposed at opposite sides of the cell region CA. The structure of the pad patterns disposed on each contact region CTA1, CTA2 will be described later herein with reference to FIGS. 3A and 3B.

Figure 2A:
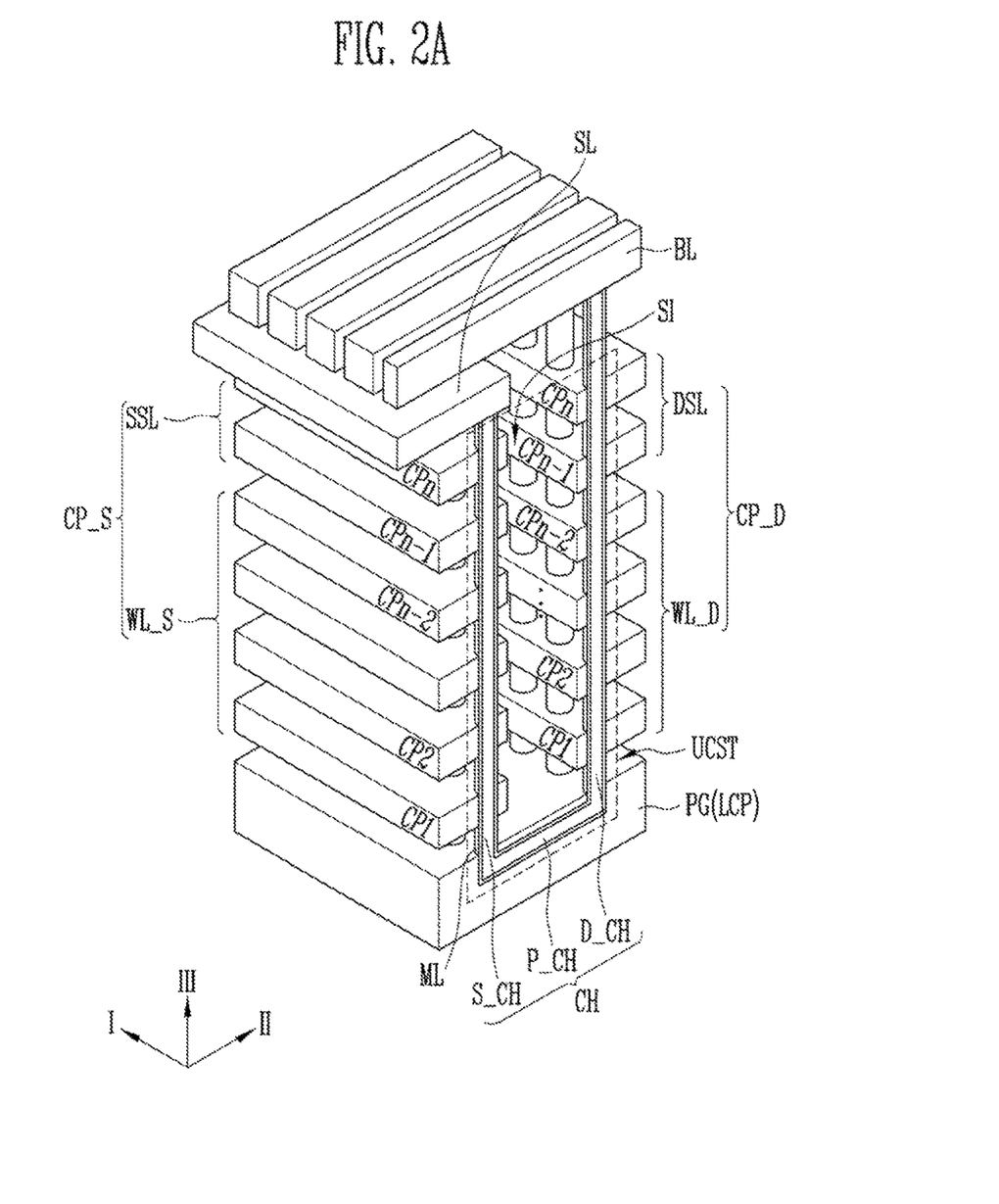
FIGS. 2A to 2C are perspective views illustrating various memory string structures according to embodiments of the present disclosure.
Figure 2B:
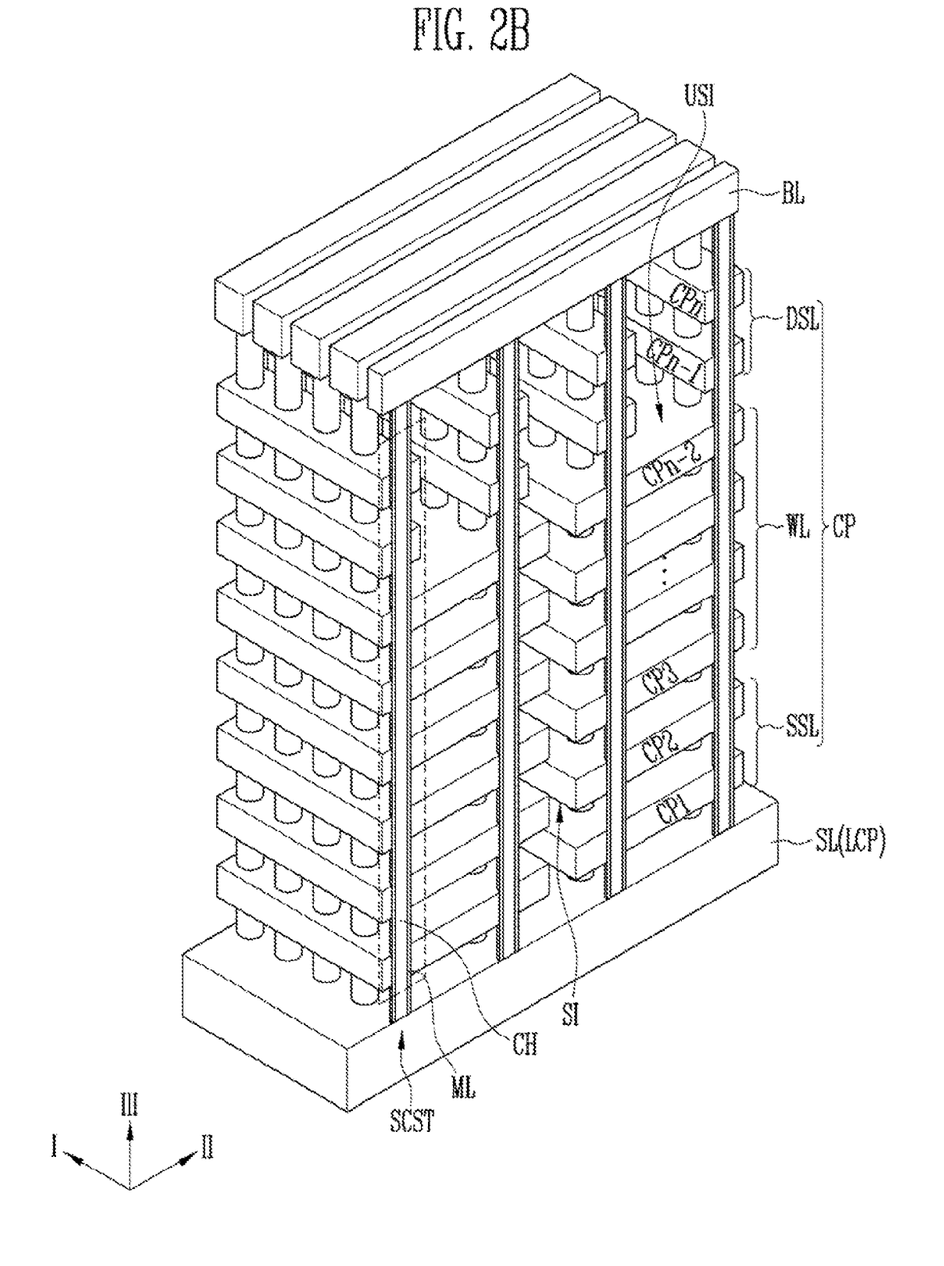
Figure 2C:
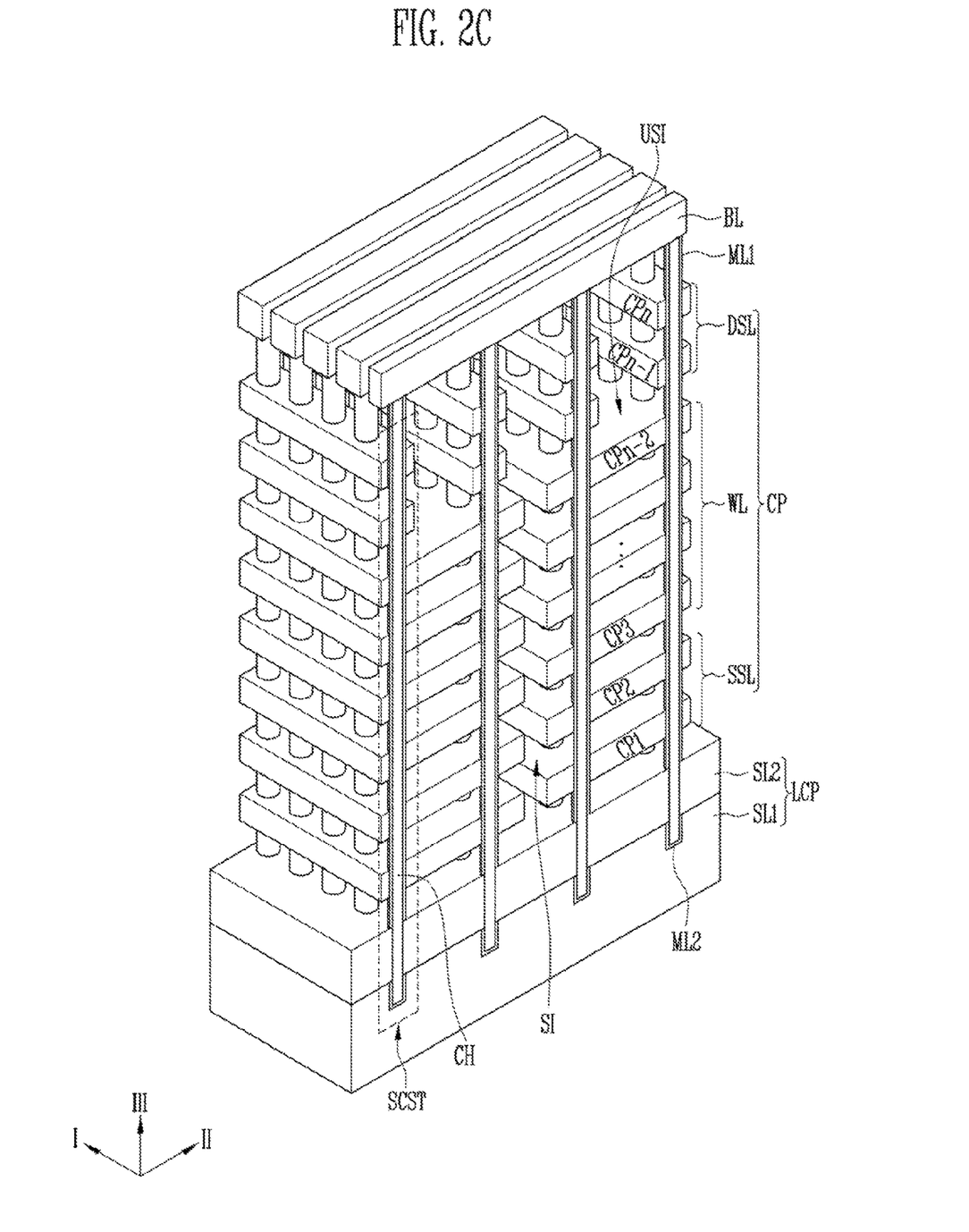

FIGS. 2A to 2C are perspective views illustrating various memory string structures according to embodiments of the present disclosure. In FIGS. 2A to 2C, multi-layers are schematically shown for the sake of Illustration, and interlayer insulating layers are not shown.

The memory string according to the embodiment of the present disclosure may be formed in a three-dimensional structure for high-density integration of the semiconductor device. For example, the memory string may be formed in a U shape, as shown in FIG. 2A, or in a straight shape, as shown in FIGS. 2B and 2C.

Referring to FIG. 2A, a U shaped memory string UCST may include memory cells and select transistors which are arranged along a U shaped channel layer CH. Gates of the memory cells and gates of the select transistors may be coupled to memory string conductive patterns CP1 to CPn.

The channel layer CH may include a pipe channel layer P_CH which is embedded in a pipe gate PG, and a source side channel layer S_CH and a drain side channel layer D_CH which extend from the pipe channel layer P_CH. The channel layer CH may be in a tube shape which surrounds a core insulating layer. The core insulating layer partially fills a central region of a U-shaped hole. In another embodiment, the U-shaped hole is completely filled with the channel layer CH.

The channel layer CH may be electrically coupled between a source line SL and a bit line BL. The bit line BL and the source line SL are disposed at different levels and spaced apart from each other. For example, the source line SL may be disposed below the bit line BL. The source line SL may be electrically coupled to an upper end of the source side channel layer S_CH. The source line SL may extend in the first direction I. A source contact plug may be formed between the source line SL and the source side channel layer S_CH. The bit line BL may be electrically coupled to an upper end of the drain side channel layer D_CH. The bit line BL may extend in a second direction II intersecting the first direction I. A drain contact plug may be formed between the bit line BL and the drain side channel layer D_CH.

The memory string conductive patterns CP1 to CPn are formed of an n number of layers, spaced apart from each other, and provided below the bit line BL and the source line SL. The memory string conductive patterns CP1 to CPn may include source side conductive patterns CP_S and drain side conductive patterns CP_D. [0032)] The source side conductive patterns CP_S may be coupled to the source side channel layer S_CH, vertically stacked on top of one another, and spaced apart from each other. The source side conductive patterns CP_S may include source side word lines WL_S and a source select line SSL. The source select line SSL may be disposed over the source side word lines WL_S. The source select line SSL may be a single-layered or a multi-layered structure and formed over the source side word lines WL_S.

Although, in the drawing, the source select line SSL is configured by an $n^{th}$ pattern CPn that is disposed at an uppermost layer of the source side conductive patterns CP_S and the n−1th pattern CPn−1 among the source side conductive patterns CP_S, the present disclosure is not limited to this. The n−$1^{th}$ pattern CPn−1 is disposed below the $n^{th}$ pattern CPn.

The drain side conductive patterns CP_D may be coupled to the drain side channel layer D_CH, be vertically stacked on top of one another, and be spaced apart from each other. The drain side conductive patterns CP_D may include drain side word lines WL_D and a drain select line DSL. The drain select line DSL may be disposed over the drain side word lines WL_D. The drain select line DSL may be disposed over the drain side word lines WL_D and have a single-layered or a multi-layered structure. Although, in the drawing, the drain select line DSL is configured by an $n^{th}$ pattern CPn that is disposed at an uppermost layer of the drain side conductive patterns CP_D and the n−$1^{th}$ pattern CPn−1 which is disposed below the $n^{th}$ pattern CPn, the present disclosure is not limited to this.

The source side conductive patterns CP_S and the drain side conductive patterns CP_D may be separated from each other by a slit SI. The slit SI is formed between the source side conductive patterns CP_S and the drain side conductive patterns CP_D. The source side conductive patterns CP_S and the drain side conductive patterns CP_D may extend in the first direction I to over any one of the contact regions CTA1 and CTA2 shown in FIG. 1.

The pipe gate PG is disposed below the source side conductive patterns CP_S and the drain side conductive patterns CP_D. The pipe gate PG is formed to surround the pipe channel layer P_CH. The pipe gate PG is disposed below the memory string conductive patterns CP1 to CPn and may be referred to as a lower conductive pattern LCP. The lower conductive pattern LCP pertains to the operation of a memory string USCT.

An outer surface of the channel layer CH may be surrounded by a multi-layer ML including a tunnel insulating layer, a data storage layer and a blocking insulating layer. The tunnel insulating layer may be formed over an outer surface of the channel layer CH and be formed in a shape corresponding to the shape of the outer surface of the channel layer CH.

The data storage layer may be formed over an outer surface of the tunnel insulating layer and be formed in a shape corresponding to the shape of the outer surface of the tunnel insulating layer. The blocking insulating layer may be formed over an outer surface of the data storage layer and be formed in a shape corresponding to the shape of the outer surface of the data storage layer.

Although not shown, the multi-layer ML may be formed along a side surface of each of the memory string conductive patterns CP1 to CPn that contact the channel layer CH, and may extend along upper and lower surfaces of each of the memory string conductive patterns CP1 to CPn. In this case, the multi-layer ML may be not formed in the slit SI and have a C-shaped cross-section.

According to the above-mentioned configuration, source side memory cells are formed at intersections between the source side channel layer S_CH and the source side word lines WL_S, and drain side memory cells are formed at intersections between the drain side channel layer D_CH and the drain side word lines WL_D. A source select transistor is formed at an intersection between the source side channel layer S_CH and the source select line SSL, and a drain select transistor is formed at an intersection between the drain side channel layer D_CH and the drain select line DSL.

A pipe transistor is formed at an intersection between the pipe channel layer P_CH and the pipe gate PG. The source select transistor, the source side memory cells, the pipe transistor, the drain side memory cells and the drain select transistor that are arranged along the single channel layer CH may be coupled in series through the channel layer CH. The source select transistor, the source side memory cells, the pipe transistor, the drain side memory cells and the drain select transistor that are coupled in series defines a U shaped memory string UCST along the U shape of the channel layer CH.

The source side word lines WL_S may transmit signals to gates of the source side memory cells. The drain side word lines WL_D may transmit signals to gates of the drain side memory cells. The source select line SSL may transmit a signal to a gate of the source select transistor. The drain select line DSL may transmit a signal to a gate of the drain select transistor. The pipe gate PG may transmit a signal to a gate of the pipe transistor. The pipe transistor may couple the source side memory cells and the drain side memory cells to each other in response to a signal applied to the pipe gate PG.

The channel CH may be formed in various shapes, for example, a W shape, as well as the above-mentioned U shape. The arrangement of the memory cells may be changed in various forms depending on the structure of the channel layer CH, whereby the memory string structure may have various forms.

Referring to FIGS. 2B and 2C, a straight memory string SCST may include memory cells and select transistors which are stacked along a straight channel layer CH. Gates of the memory cells and gates of the select transistors may be coupled to memory string conductive patterns CP1 to CPn.

The channel layer CH may be formed in the form of a tube. Under this structure, a core insulating layer partially fills a central region of a straight hole and the channel layer CH surrounds the core insulating layer. In another embodiment, the channel layer CH may be formed in an embedded shape. Under that structure, the central region of the straight hole is completely filled with the channel layer CH.

An upper end of the channel layer CH may be electrically coupled to a bit line BL. The bit line BL may extend in the second direction II. A drain contact plug (not shown) may be further formed between the bit line BL and the channel layer CH.

The channel layer CH may be coupled to a lower conductive pattern LCP. The lower conductive pattern LCP may be formed in various structures.

As shown in FIG. 2B, the lower conductive pattern LCP may include a source line SL which is brought into contact with the bottom of the channel layer CH. The source line SL may be a doped polysilicon layer. The channel layer CH is formed on an upper surface of the source line SL and extends in a third direction III toward the bit line BL.

A side surface of the channel layer CH shown in FIG. 2B may be surrounded by a multi-layer ML including a tunnel insulating layer, a data storage layer and a blocking insulating layer. The tunnel insulating layer may be formed over the side surface of the channel layer CH and be formed along the side surface of the channel layer CH. The data storage layer may be formed over the tunnel insulating layer and be formed along a side surface of the tunnel insulating layer. The blocking insulating layer may be formed over the data storage layer and be formed along a side surface of the data storage layer.

Although not shown, the multi-layer ML may be formed along a side surface of each of the memory string conductive patterns CP that come into contact with the channel layer CH, and may extend along upper and lower surfaces of each of the memory string conductive patterns CP. In this case, the multi-layer ML may not be formed in slits SI and USI and have a C-shaped cross-section.

As shown in FIG. 2C, a portion of the lower end of the channel layer CH may extend into the lower conductive pattern LCP. In other words, the lower end of the channel layer CH may pass through a portion of the lower conductive pattern LCP.

In more detail, the lower conductive pattern LCP may include a source line having a first source layer SL1 and a second source layer SL2 which form a stacked structure. The first source layer SL1 may surround the lower end of the channel layer CH1. The second source layer SL2 may be disposed on the first source layer SL1 and come into contact with an upper surface of the first source layer SL1 and the side surface of the channel layer CH. The second source layer SL2 may surround the channel layer CH.

The outer surface of the channel layer CH shown in FIG. 2C may be surrounded by a first multi-layer ML1 or a second multi-layer ML2. Each of the first multi-layer ML1 and the second multi-layer ML2 may include a tunnel insulating layer, a data storage layer, and a blocking insulating layer. The tunnel insulating layer may be formed over the channel layer CH and be formed along the outer surface of the channel layer CH. The data storage layer may be formed over the tunnel insulating layer and extend along the tunnel insulating layer. The blocking insulating layer may be formed over the data storage layer and extend along the data storage layer.

The first multi-layer ML1 is formed over the outer side surface of an upper portion of the channel layer CH that protrudes from the lower conductive pattern LCP. The second multi-layer ML2 is disposed between the first source layer SL1 and the channel layer CH. The first multi-layer ML1 and the second multi-layer ML2 may be separated from each other with the second source layer SL2 interposed therebetween.

Referring to FIGS. 2B and 2C, the memory string conductive patterns CP1 to CPn may be formed of n number of layers, spaced apart from each other, and arranged between the bit line BL and the lower conductive pattern LCP. The memory string conductive patterns CP1 to CPn may be surround the channel layer CH, and, stacked over one another, and spaced apart from each other.

The memory string conductive patterns CP1 to CPn may include a source select line SSL, word lines WL and a drain select line DSL. The source select line SSL may be disposed over the lower conductive pattern LCP. The word lines WL may be disposed over the source select lines SSL. The drain select line DSL may be disposed over the word lines WL. The memory string conductive patterns CP1 to CPn may be divided into a plurality of stacked structures by the slit SI.

The source select line SSL may be a single-layered or two- or multi-layered structure and located below the word lines WL. Although, in the drawing, a first pattern CP1 that is disposed at a lowermost layer of the memory string conductive patterns CP1 to CPn and a second pattern CP2 which is disposed over the first pattern CP1 serve as the source select line SSL, the present disclosure is not limited to this structure.

The drain select line DSL may be a single-layered or two- or multi-layered structure and located over the word lines WL. Although, in the drawing, an $n^{th}$ pattern CPn that is disposed at an uppermost layer of the memory string conductive patterns CP1 to CPn and an $n-1^{th}$ pattern CPn-1 disposed below the $n^{th}$ pattern CPn serve as the drain select line DSL, the present disclosure is not limited to this structure.

The memory string conductive patterns CP1 to CPn may be divided into a plurality of stacks by the slit SI. The source select line SSL or the drain select line DSL may have a smaller width than the word lines WL. For example, each of the word lines WL may surround two or more rows of channel layers CH. On the other hand, the drain select line DSL may surround a single row of channel layer CH. Both of the word lines WL and the drain select line DSL are divided into a plurality of stacks by the slit SI. Then, the drain select line DSL is further divided into a plurality of portions by an upper slit USI so that the width of the drain select line DSL is smaller than that of the word lines WL.

According to the configuration described with reference to FIGS. 2B and 2C, memory cells are formed at intersections between the channel layer CH and the word lines WL, a drain select transistor is formed at an intersection between the channel CH and the drain select line DSL, and a source select transistor is formed at an intersection between the channel layer CH and the source select line SSL. The source select transistor, the memory cells and the drain select transistor that are arranged in a line along the single channel layer CH are coupled in series to each other through the channel layer CH and thus define a straight memory string SCST. The word lines WL may transmit signals to gates of the memory cells. The source select line SSL may transmit a signal to a gate of the source select transistor. The drain select line DSL may transmit a signal to a gate of the drain select transistor.

The semiconductor devices described with reference to FIGS. 2A to 2C include the lower conductive pattern LCP and the memory string conductive patterns CP1 to CPn. The memory string conductive patterns CP1 to CPn are disposed over the lower conductive pattern LCP, stacked over one another, and spaced apart from each other. Although not shown, an interlayer insulating layer may be interposed between adjacent layers of the memory string conductive patterns CP1 to CPn. Pad patterns extending from one ends of the memory string conductive patterns CP1 to CPn form a stepped structure on a contact region.

Figure 3A:
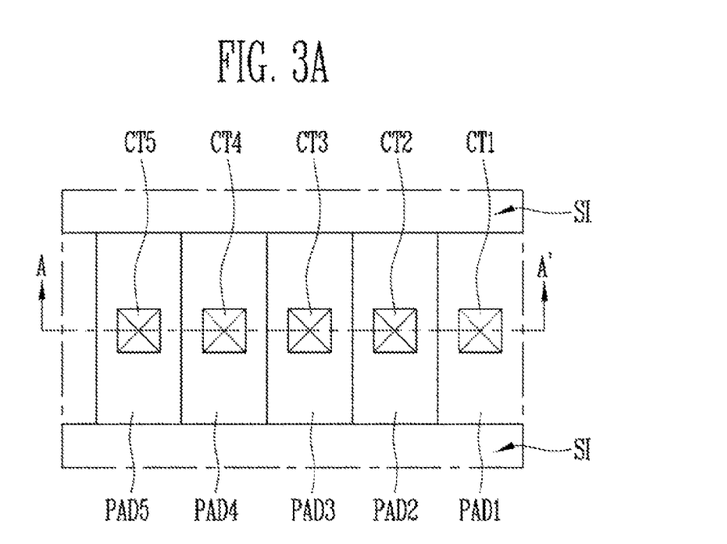
FIG. 3A is a plan view of a contact region according to an embodiment of the present disclosure.
Figure 3B:
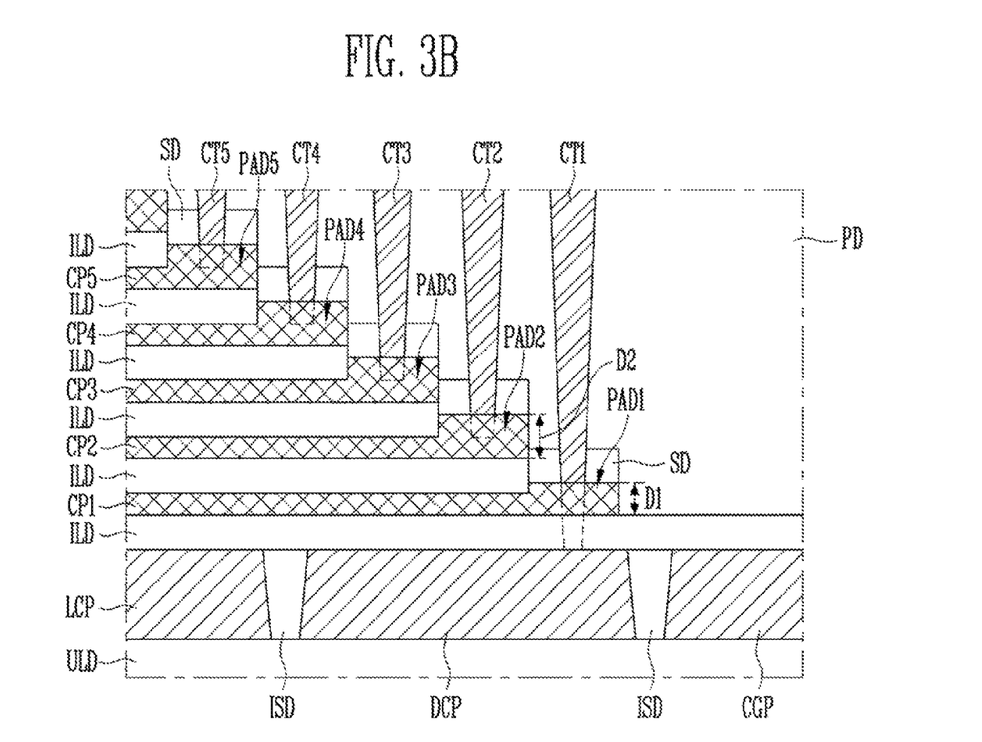
FIG. 3B is a sectional view taken along the line A-A' of FIG. 3A.

FIGS. 3A and 3B are a plan view and a sectional view of a contact region according to an embodiment of the present disclosure, respectively. FIG. 3A is a plan view of a stepped structure formed on the contact region.

Referring to FIG. 3A, pad patterns PAD1 to PAD5 disposed over the contact region form a stepped structure. The pad patterns PAD1 to PAD5 may include a first pad pattern PAD1 and upper pad patterns PAD2 to PAD5 which are disposed over the first pad pattern PAD1. The number of upper pad patterns PAD2 to PAD5 is not limited to the number illustrated in the drawing and may be changed depending on the number of the memory string conductive patterns which are stacked. The upper pad patterns PAD2 to PAD5 do not overlap the first pad pattern PAD1.

The pad patterns PAD1 to PAD5 may extend from respective one ends of the drain side word lines WL_D or the source side word lines WL_S shown in FIG. 2A and form a stepped structure. In this case, among the pad patterns PAD1 to PAD5, the first pad pattern PAD1 may be disposed most adjacent to the pipe gate PG that functions as the lower conductive pattern LCP shown in FIG. 2A. Furthermore, the first pad pattern PAD1 may extend from the first conductive pattern CP1 that is most adjacent to the pipe gate PG among the memory string conductive patterns CP1 to CPn shown in FIG. 2A.

The pad pattern PAD1 to PAD5 may extend from the respective one ends of the memory string conductive patterns CP1 to CPn shown in FIG. 2B or 2C and form a stepped structure. In this case, among the pad patterns PAD1 to PAD5, the first pad pattern PAD1 may be disposed most adjacent to the lower conductive pattern LCP shown in FIG. 2B or 2C. In more detail, the first pad pattern PAD1 may be disposed adjacent to the source line SL shown in FIG. 2B. Alternatively, the first pad pattern PAD1 may be disposed adjacent to the second source layer SL2.

Furthermore, the first pad pattern PAD1 may extend from the first conductive pattern CP1 disposed at the lowermost layer among the source select lines SSL shown in FIG. 2B or 2C. The upper pad patterns PAD2 to PAD5 may respectively extend from the second conductive pattern CP2 of the source select line SSL and the word lines WL that are disposed over the first conductive pattern CP1 shown in FIG. 2B or 2C, and may not overlap the first pad pattern PAD1.

The pad patterns PAD1 to PAD5 may be divided into a plurality of stacked structures by a slit SI. The slit SI may extend from any one of the slits SI shown in FIGS. 2A to 2C.

The pad patterns PAD1 to PAD5 that form the stepped structure may respectively come into contact with contact plugs CT1 to CT5. Hereinafter, the cross-sectional structure of the pad patterns PAD1 to PAD5 and the contact plugs CT1 to CT5 will be described in detail with reference to FIG. 3B. FIG. 3B is a sectional view taken along line A-A' of FIG. 3A.

Referring to FIG. 3B, the pad patterns PAD1 to PAD5 may extend from the respective one ends of the memory string conductive patterns CP1 to CP5 and form a stepped structure. The memory string conductive patterns CP1 to CP5 and the pad patterns PAD1 to PAD5 are disposed over respective interlayer insulating layers ILD. In other words, the memory string conductive patterns CP1 to CP5 and the interlayer insulating layers ILD may be alternately stacked. The pad patterns PAD1 to PAD5 and the interlayer insulating layers ILD may also be alternately stacked.

The memory string conductive patterns CP1 to CP5 may extend from the cell region to the contact region. The closer to the lower conductive pattern LCP it is located, the farther it extends toward the contact region. In this way, the lengths of the memory string conductive patterns CP1 to CP5 may differ from each other, and the one ends of the memory string conductive patterns CP1 to CP5 may extend to different locations from each other.

The pad patterns PAD1 to PAD5 may respectively extend from the one ends of the memory string conductive patterns CP1 to CP5 that are disposed at respective different locations from each other. Pad insulating patterns SD may be further formed over the respective pad patterns PAD1 to PAD5. The pad patterns PAD1 to PAD5 may be thicker than the respective memory string conductive patterns CP1 to CP5.

The memory string conductive patterns CP1 to CP5 and the interlayer insulating layers ILD may be disposed over the lower conductive pattern LCP. A lower interlayer insulating layer ULD may be disposed under the lower conductive pattern LCP. The lower interlayer insulating layer ULD may insulate the lower conductive pattern LCP from drive circuit devices (not shown) which may be disposed below the lower conductive pattern LCP.

The lower conductive pattern LCP may be any one of the pipe gate PG described with reference to FIG. 2A, the source line SL described with reference to FIG. 2B, and the second source layer SL2 described with reference to FIG. 2C. A floating conductive pattern DCP and a drive circuit gate pattern CGP may be further formed at the same level as the lower conductive pattern LCP. The lower conductive pattern LCP, the floating conductive pattern DCP and the drive circuit gate pattern CGP may be spaced apart from each other and located at the same level. The lower conductive pattern LCP, the floating conductive pattern DCP and the drive circuit gate pattern CGP may be separated from each other by separation insulating layers ISD.

The positions of the separation insulating layers ISD may not be limited to positions shown in the drawings, and may be changed in various ways. An area of the floating conductive pattern DCP may vary depending on a design of the separation insulating layers ISD. For example, the floating conductive pattern DCP may overlap the first pad pattern PAD1 only. Alternatively, the floating conductive pattern DCP may overlap two or more pad patterns including the first pad pattern PAD1.

A thickness D1 of the first pad pattern PAD1 may be smaller than a thickness D2 of each of the upper pad patterns PAD2 to PAD5. That is, the first pad pattern PAD1 may have the smallest thickness among the pad patterns PAD1 to PAD5.

The pad patterns PAD1 to PAD5 that form the stepped structure may be covered with a planarization insulating layer PD. The contact plugs CT1 to CT5 may pass through the planarization insulating layer PD. To contact the pad patterns PAD1 to PAD5, the contact plugs CT1 to CT5 may extend in the direction in which the drain side channel layer D_CH and the source side channel layer S_CH shown in FIG. 2A extend, or in the direction in which the channel layer CH shown in FIGS. 2B and 2C extend. That is, the contact plugs CT1 to CT5 may extend in the direction in which the memory string conductive patterns CP1 to CP5 are stacked. The contact plugs CT1 to CT5 may pass through the pad insulating patterns SD and be coupled to the pad patterns PAD1 to PAD5.

The contact plugs CT1 to CT5 are directly coupled to the pad patterns PAD1 to PAD5 that are thicker than the memory string conductive patterns CP1 to CP5, rather than being directly coupled to the memory string conductive patterns CP1 to CP5. Thereby, during a process of forming the contact plugs CT1 to CT5, each of the contact plugs CT1 to CT5 can be prevented from passing through a corresponding target memory string conductive pattern, CP1 to CP5, having a relatively thin thickness. Thus, a contact between the contact plugs CT1 to CT5 and non-target memory string conductive patterns that are disposed below the target memory string conductive patterns, may be reduced or prevented by the pad patterns PAD 1 to PAD 5.

The first contact plug CT1 coupled to the first pad pattern PAD1 may overlap the floating conductive pattern DCP. During the process of forming the contact plugs CT1 to CT5, the contact plugs CT1 to CT5 may extend into the respective pad patterns PAD1 to PAD5. In this case, as shown by the broken line, the first contact plug CT1 may completely pass through the first pad pattern PAD1 having a comparatively small thickness and come into contact with the floating conductive pattern DCP. The floating conductive pattern DCP is in a floating state. That is, the floating conductive pattern DCP is spaced apart from the lower conductive pattern LCP and the drive circuit gate pattern CGP and is electrically isolated by the separation insulating layers ISD. The lower conductive pattern LCP and the drive circuit gate patterns CGP pertain to the operation of the semiconductor device. The floating conductive pattern DCP does not pertain to the operation of the semiconductor device. Therefore, even if the first contact plug CT1 comes into contact with the floating conductive pattern DCP, an operation failure of the semiconductor device can be prevented.

Since the upper pad patterns PAD2 to PAD5 are coupled to the contact plugs CT2 to CT5, respectively, and are thicker than the first pad pattern PAD1, the bottom of the contact plugs CT2 to CT5 may be disposed in the upper pad patterns PAD2 to PAD5, as shown by the broken line, without completely passing through the upper pad patterns PAD2 to PAD5.

The drive circuit gate pattern CGP may be a gate pattern of a drive transistor that forms a circuit for driving the memory string.

In the embodiment of the present disclosure, the floating conductive pattern DCP overlapping the first contact plug CT1 is separated from the lower conductive pattern LCP and the drive circuit gate pattern CGP. Thereby, in the embodiment of the present disclosure, even if the first contact plug CT1 and the floating conductive pattern DCP are coupled with each other, an operation failure of the semiconductor device can be prevented.

Figure 4:
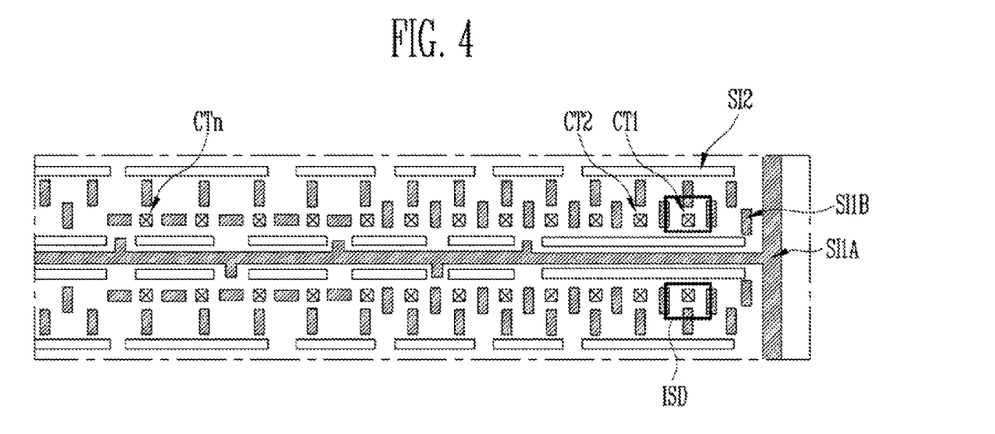
FIGS. 4 and 5 are plan views illustrating various layouts of the contact region according to embodiments of the present disclosure.
Figure 5:
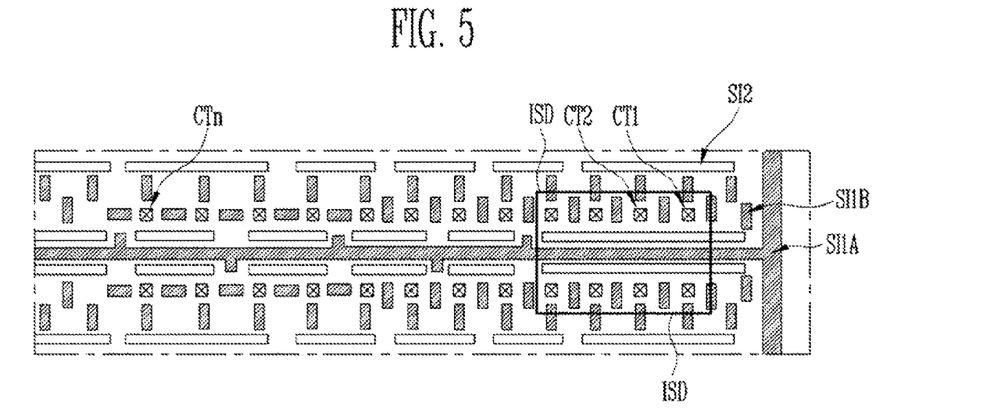

FIGS. 4 and 5 are plan views illustrating various layouts of the contact region according to embodiments of the present disclosure. Referring to FIGS. 4 and 5, a stack of pad patterns extends from the memory string conductive patterns, as described with reference to FIGS. 2A to 2C, to the contact region and may be divided into a plurality of pad stacks constituting memory blocks by a first-type first slit SI1A. As shown in FIG. 3B, the pad patterns may have a thickness larger than that of the memory string conductive patterns. The first-type first slit SI1A may extend to the cell region and divide a stack of memory string conductive patterns into a plurality of line stacks constituting the memory blocks.

The first-type first slit SI1A may be formed simultaneously with a second-type first slit SI1B. The second-type first slit SI1B may function as a support that supports the stacks during a process of forming the memory string.

A second slit SI2 may be further formed in the contact region. The second slit SI2 may be formed simultaneously with the slit (SI of FIGS. 2A to 2C) that separates the memory string conductive patterns described with reference to FIGS. 2A to 2C. The slit SI shown in FIGS. 2A to 2C and the second slit SI2 may be used as inlets for conductive material in a process for forming the pad patterns and the memory string conductive patterns. The second slit SI2 may pass through portions of the memory string conductive patterns and the pad patterns.

The contact plugs CT1 to CTn may be respectively coupled to the pad patterns extending from the memory string conductive patterns described with reference to FIGS. 2A to 2C. The sectional structure of the contact plugs CT1 to CTn is shown in FIG. 3B.

The separation insulating layer ISD is disposed on the contact region and may define a location of the floating conductive pattern DCP. See FIG. 3B. The separation insulating layer ISD may surround the floating conductive pattern DCP. See FIG. 3B. The separation insulating layer ISD may have a closed-loop shape.

The separation insulating layer ISD may not overlap the second slit SI2. Since the separation insulating layer ISD does not overlap the second slit SI2, conductive material can be prevented from remaining in the separation insulating layer ISD during the process of forming the memory string conductive patterns and the pad patterns through the second slit SI2. When conductive material remains in the separation insulating layer ISD, a failure may occur in that the floating conductive pattern and the lower conductive pattern LCP shown in FIG. 3B are electrically coupled to each other by the remaining conductive material. However, the present disclosure can prevent such a phenomenon.

The separation insulating layer ISD may have various shapes and various areas. For example, as shown in FIG. 4, the separation insulating layer ISD may be arranged so that the single first contact plug CT1 of the contact plugs CT1 to CTn overlap the single floating conductive pattern. In this case, the floating conductive pattern may overlap the corresponding single first contact plug CT1, but may not overlap the other contact plugs CT2 to CTn. Furthermore, the separation insulating layer ISD may overlap the second-type first slit SI1B.

Alternatively, as shown in FIG. 5, the separation insulating layer ISD may be arranged so that the floating conductive pattern has a larger size than shown in FIG. 4. For example, the separation insulating layer ISD may be arranged so that the signal floating conductive pattern DCP of FIG. 3B overlaps, among the contact plugs CT1 to CTn, two first contact plugs CT1 which are coupled to two different memory blocks from each other. In this case, the separation insulating layer ISD may overlap a portion of the first-type first slit SI1A that is disposed on a boundary between the two different memory blocks. Furthermore, the separation insulating layer ISD may overlap the second-type first slit SI1B.

FIGS. 6A to 6F are sectional views illustrating a method of manufacturing a semiconductor device according to an embodiment of the present disclosure. FIGS. 6A to 6F are sectional views taken along line A-A' of FIG. 3A.

Figure 6A:
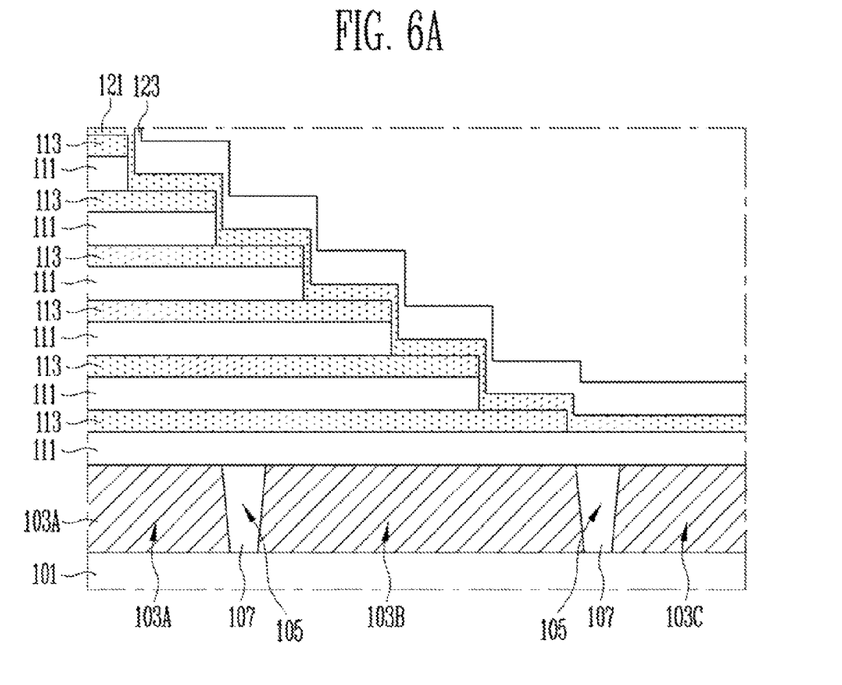
FIGS. 6A to 6F are sectional views illustrating a method of manufacturing a semiconductor device according to an embodiment of the present disclosure.

Referring to FIG. 6A, the lower conductive layer is formed on the lower interlayer insulating layer 101. Thereafter, trenches 105 are formed to pass through the lower conductive layer by etching the lower conducive layer. The trenches 105 may divide the lower conductive layer into the lower conductive pattern 103A, the floating conductive pattern 103B and the drive circuit gate pattern 103C. Hereinafter, the lower conductive pattern 103A, the floating conductive pattern 103B and the drive circuit gate pattern 103C, in combination, are referred to as a divided lower conductive layer.

Subsequently, the trenches 105 are filled with the separation insulating layers 107. The lower conductive layer may be made of conductive material for pipe gates or conductive material for source lines. For example, the lower conductive layer may be made of a polysilicon layer.

Thereafter, interlayer insulating layers 111 and sacrificial layers 113 are alternately stacked over the divided lower conductive layer such that they cover the separation insulating layers 107. The number of interlayer insulating layers 111 and sacrificial layers 113 may vary depending on a device design. The interlayer insulating layers 111 and the sacrificial layers 113 may be made of different materials. In more detail, the sacrificial layers 113 may be made of material having a different etch selectivity from the interlayer insulating layers 111. For example, the interlayer insulating layers 111 may be made of oxide layers, and the sacrificial layers 113 may be made of nitride layers having a different etch selectivity from the oxide layers.

Thereafter, a stepped structure is formed by etching the interlayer insulating layers 111 and the sacrificial layers 113. In this regard, each step of the stepped structure may be formed of a stack of a single first interlayer insulating layer 111 and a single sacrificial layer 113, and formed on the first interlayer insulating layer 111. Some portion of each of the sacrificial layers 113 is exposed through the stepped structure.

Although not shown, after or before the step of forming the stepped structure, the channel layer CH described with reference to FIGS. 2A to 2C may be formed in the cell region.

Thereafter, the pad layer 121 is formed along the surfaces of the portions of the sacrificial layers 113 that are exposed through the stepped structure. The pad layer 121 is formed alongside surfaces and upper surfaces of the stepped structure. The pad layer 121 may be made of material having a different etch selectivity from the interlayer insulating layers 111. The pad layer 121 may be made of the same material as that of the sacrificial layers 113. For example, the pad layer 121 may be made of a nitride layer.

Subsequently, a pad insulating layer 123 is formed on the pad layer 121. The pad insulating layer 123 may be formed along the surface of the pad layer 121. The pad insulating layer 123 may be made of insulating material having a poor step coverage characteristic. In more detail, the pad insulating layer 123 may be formed by an insulating material deposition method so that the thickness thereof on the side surfaces of the stepped structure is greater than that on the upper surfaces of the stepped structure. For example, the pad insulating layer 123 may include an HDP (high density plasma) oxide layer, a PE-TEOS (plasma enhanced-tetra ethyl ortho silicate) oxide layer, a USG (undoped silicate glass) oxide layer, or a combination thereof.

Figure 6B:
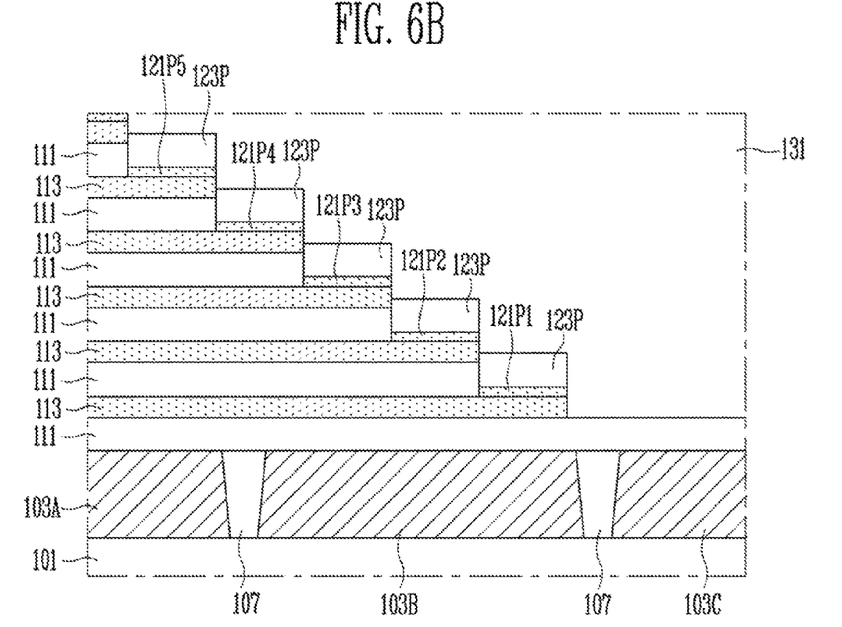

Referring to FIG. 6B, pad insulating patterns 123P are formed by etching the pad insulating layer 123 of FIG. 6A.

The pad insulating patterns 123P may be formed by etching the pad insulating layer 123 of FIG. 6A such that the pad layer 121 of FIG. 6A formed along the side surfaces of the stepped structure is exposed.

Thereafter, portions of the pad layer 121 of FIG. 6A that are formed along the side surfaces of the stepped structure are removed by etching the pad layer 121 of FIG. 6A through an etching process using the pad insulating patterns 123P as an etch barrier. Thereby, side surfaces of the sacrificial layers 113 are exposed, and separated preliminary pad patterns 121P1 to 121P5 are formed. The preliminary pad patterns 121P1 to 121P5 are respectively disposed on the sacrificial layers 113.

Subsequently, the first-type first slit may be formed to divide a stack of the pad insulating patterns 123P, the preliminary pad patterns 121P1 to 121P5, the interlayer insulating layers 111 and the sacrificial layers 113 into a plurality of stacks each of which forms a memory block. The second-type first slit may be formed simultaneously with the first-type first slit. The first-type first slit and the second-type first slit may be formed as shown in FIG. 4 or 5. Thereafter, a planarization insulating layer 131 may be formed to cover slit insulating layers (not shown), the preliminary pad patterns 121P1 to 121P5 and the stepped structure. The slit insulating layers are formed in the first-type first slits and the second-type first slits. The planarization insulating layer 131 may be made of an oxide layer, and the surface thereof may be planarized through a planarization process.

Figure 6C:
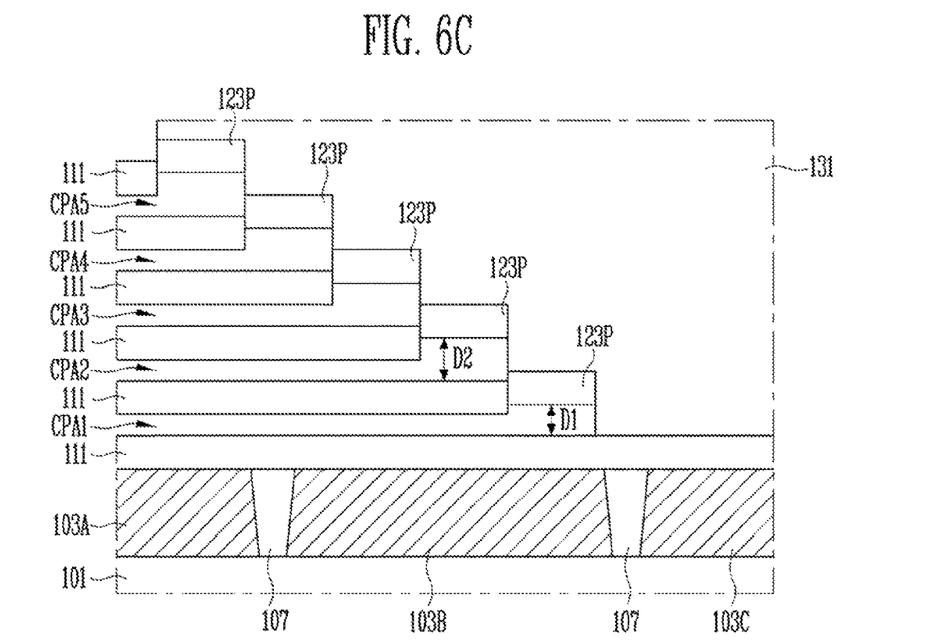

Referring to FIG. 6C, conductive regions CPA1 to CPA5 are opened by selectively removing the sacrificial layers 113 of FIG. 6B and the preliminary pad patterns 121P1 to 121P5 of FIG. 6B. The ends of the interlayer insulating layers 111 and the pad insulating patterns 123P which are disposed between the conductive regions CPA2 to CPA5 may bend due to process stress. Due to this, gaps formed in the ends of the conductive regions CPA2 to CPA5 may be greater than that of the end of the lowermost conductive region CPA1. As a result, the end of the lowermost conductive region CPA1 may have a thickness D1 less than a thickness D2 of the end of each of the other conductive regions CPA2 to CPA5.

The sacrificial layers 113 of FIG. 6B and the preliminary pad patterns 121P1 to 121P5 of FIG. 6B may be removed through the slit or the second slit. The slit or the second slit may be formed to pass through the planarization insulating layer 131, the pad insulating patterns 123P, the preliminary pad patterns 121P, the sacrificial layers 113 and the interlayer insulating layers 111. The slit may be disposed as shown in FIG. 2A to 2C or 3A, and the second slit may be disposed as shown in FIGS. 4 and 5.

Figure 6D:
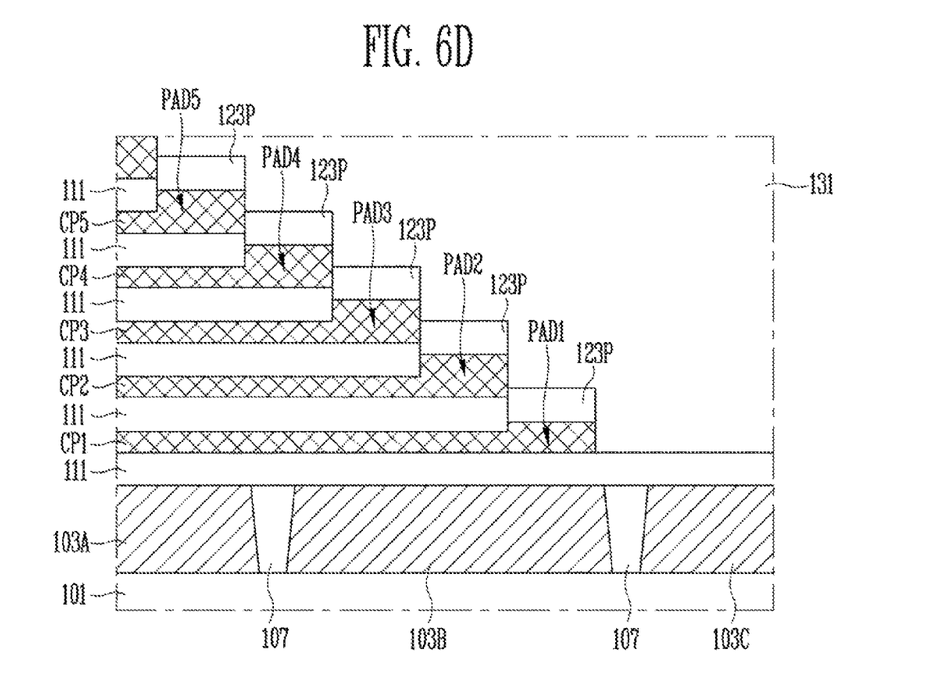

Referring to FIG. 6D, the conductive patterns CP1 to CP5 and the pad patterns PAD1 to PAD5 extending from the conductive patterns CP1 to CP5 may be formed by filling the conductive regions CPA1 to CPA5 of FIG. 6C with conductive material. The pad patterns PAD1 to PAD5 may be formed in the ends of the conductive regions CPA1 to CPA5 in which the preliminary pad patterns 121P1 to 121P5 had been disposed. The conductive regions CPA1 to CPA5 may be filled with conductive material through the slit or the second slit.

Figure 6E:
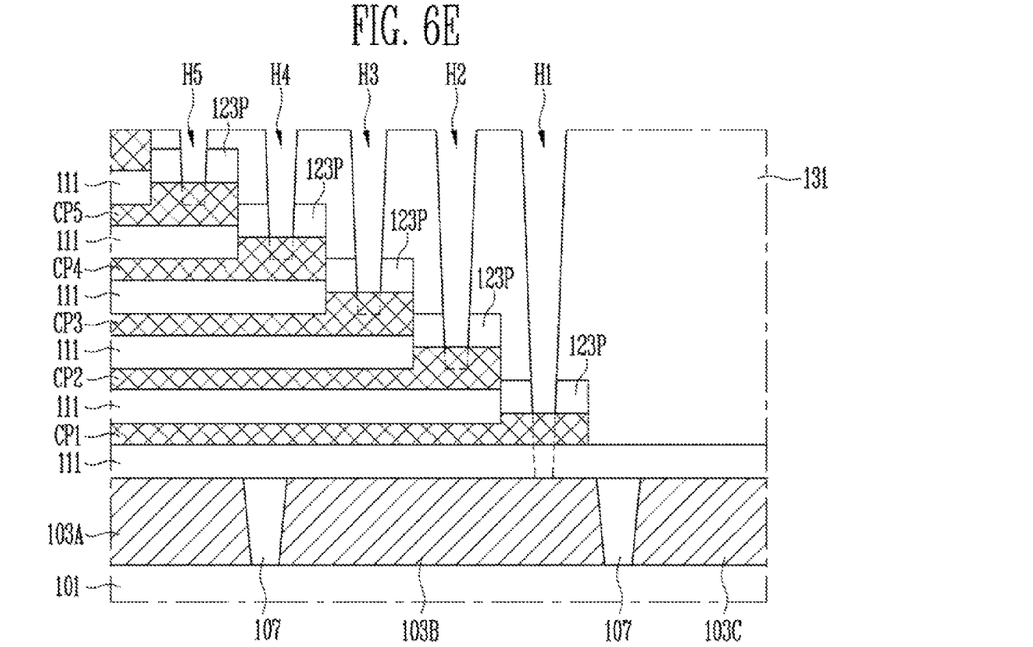

Referring to FIG. 6E, contact holes H1 to H5 are formed to pass through the planarization insulating layer 131 by etching the planarization insulating layer 131. In this regard, the pad insulating patterns 123P may be further etched, and thus the contact holes H1 to H5 may pass through the pad insulating patterns 123P so that the pad patterns PAD1 to PAD5 can be exposed.

During the etching process for forming the contact holes H1 to H5, the depths of the contact holes H1 to H5 may extend to portions indicated by the broken lines. The upper pad patterns PAD2 to PAD5, which are thicker than the pad pattern PAD 1, are not completely etched to a full depth by the etching process for forming the contact holes H1 to H5. Therefore, the bottoms of the contact holes H2 to H5 may be disposed in the upper pad patterns PAD2 to PAD5. On the other hand, the first pad pattern PAD1, which has a smaller thickness than the upper pad patterns PAD2 to PAD5, may be completely etched to a full depth through the etching process for forming the contact holes H1 to H5. The first contact hole H1 passing through the first pad pattern PAD1 overlaps the floating conductive pattern 103B. Consequently, even if the first contact hole H1 passes through the first pad pattern PAD1, no negative effect is made to the operation of the semiconductor device since the floating conductive pattern 103B which is exposed through the first contact hole H1 is afloat.

Figure 6F:
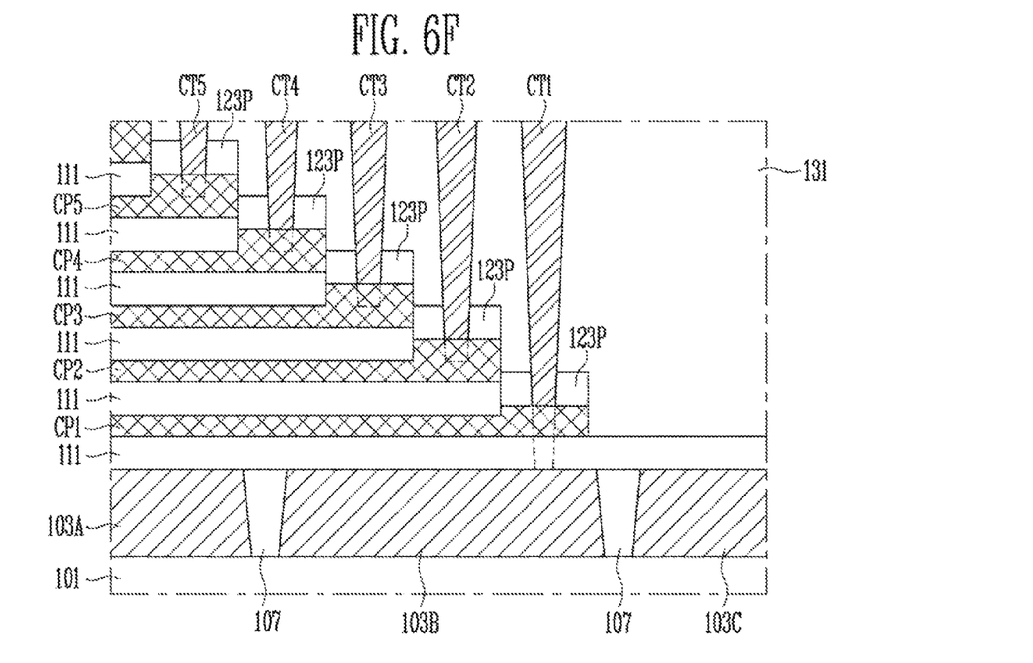

Referring to FIG. 6F, the contact holes H1 to H5 of FIG. 6E are filled with conductive material to form the contact plugs CT1 to CT5. The contact plugs CT1 to CT5 may contact the upper surfaces of the pad patterns PAD1 to PAD5 or extend into the pad patterns PAD1 to PAD5, depending on the depths of the contact holes H1 to H5.

Even if the first contact hole H1 of FIG. 6E passes through the first pad pattern PAD1, which has a relatively small thickness, the first contact plug CT1 according to the embodiment of the present disclosure is coupled to the floating conductive pattern 103B that does not affect the operation of the semiconductor device. Therefore, the embodiment of the present disclosure can prevent an operation failure of the semiconductor device which may be caused by a punching failure of the first contact plug CT1.

Although in FIGS. 6A to 6F there is illustrated an example in which the pad layer and the preliminary pad patterns are made of the same material as that of the sacrificial layers, the present disclosure is not limited to this. For example, the pad layers and the preliminary pad patterns may be made of conductive material such as tungsten. In this case, the preliminary pad patterns may not be removed during the process of removing the sacrificial layers and may remain and may serve as the pad patterns.

In the semiconductor device according to embodiments of the present disclosure, the floating conductive pattern is overlapped with and provided below the first pad pattern disposed at the lowermost position among pad patterns. The floating conductive pattern does not affect the operation of the semiconductor device. Therefore, even if the contact plug is unintentionally coupled to the first pad pattern, passes through the first pad pattern, and reaches the floating conductive pattern, an operation failure of the semiconductor device can be prevented. As a result, the embodiments of the present disclosure can enhance the operational reliability of the semiconductor device.

Figure 7:
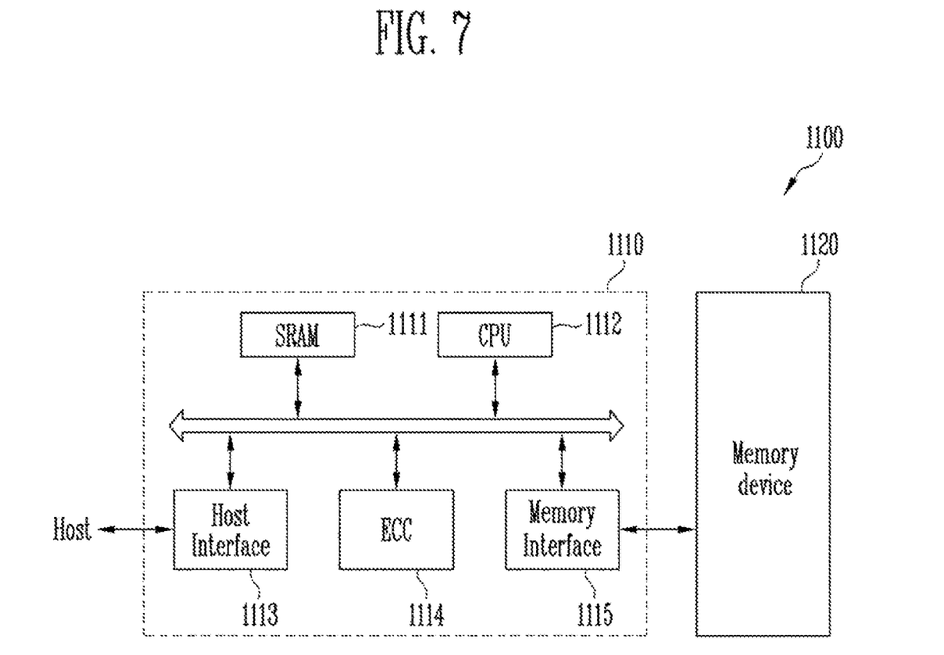
FIG. 7 is a block diagram illustrating a memory system according to an embodiment of the present disclosure.

FIG. 7 is a block diagram illustrating a memory system according to an embodiment of the present disclosure. Referring FIG. 7, the memory system 1100 according to the embodiment includes a memory device 1120 and a memory controller 1110.

The memory device 1120 may include at least one of the memory strings described with reference to FIGS. 2A to 2C. The memory device 1120 may further include pad patterns extending from conductive patterns of memory strings. A floating conductive pattern defined by a separation insulating layer may be disposed below the pad patterns and overlapped with the pad patterns. As shown in FIG. 3A, the pad patterns may be stacked to have a stepped structure, as shown in FIG. 3A. The floating conductive pattern may be defined by at least one of the separation insulating layers shown in FIGS. 38, 4 and 5. In more detail, the memory device 1120 may include: a floating conductive pattern which is afloat and thus does not affect the operation of the semiconductor device; a pad pattern which is disposed and overlaps over the floating conductive pattern; and a contact plug which contacts the pad pattern and overlaps the floating conductive pattern. The memory device 1120 may be a multi-chip package including a plurality of memory chips.

The memory controller 1110 is configured to control the memory device 1120, and may include an SRAM (Static Random Access Memory) 1111, a CPU 1112, a host interface 1113, an ECC (Error Correction Code) 1114, and a memory interface 1115. The SRAM 1111 is used as an operation memory of the CPU 1112. The CPU 1112 performs general control operations for data exchange of the memory controller 1110. The host interface 1113 is provided with a data interchange protocol of a host coupled with the memory system 1100. Furthermore, the ECC 1114 detects and corrects an error included in the data that is read from the memory device 1120, and the memory interface 1115 interfaces with the memory device 1120. In addition, the memory controller 1110 may further include a ROM (Read Only Memory) or the like that stores code data for interfacing with the host.

The above-described memory system 1100 may be a memory card or an SSD (Solid State Disk) equipped with the memory device 1120 and the controller 1110. For example, when the memory system 1100 is an SSD, the memory controller 1110 may communicate with the outside for example, a host via one of various interface protocols, such as an USB (Universal Serial Bus), an MMC (MultiMedia Card), a PCI-E (Peripheral Component Interconnection-Express), an SATA (Serial Advanced Technology Attachment), a PATA (Parallel Advanced Technology Attachment), an SCSI (Small Computer Small Interface), an ESDI (Enhanced Small Disk Interface), or an IDE (Integrated Drive Electronics.

Figure 8:
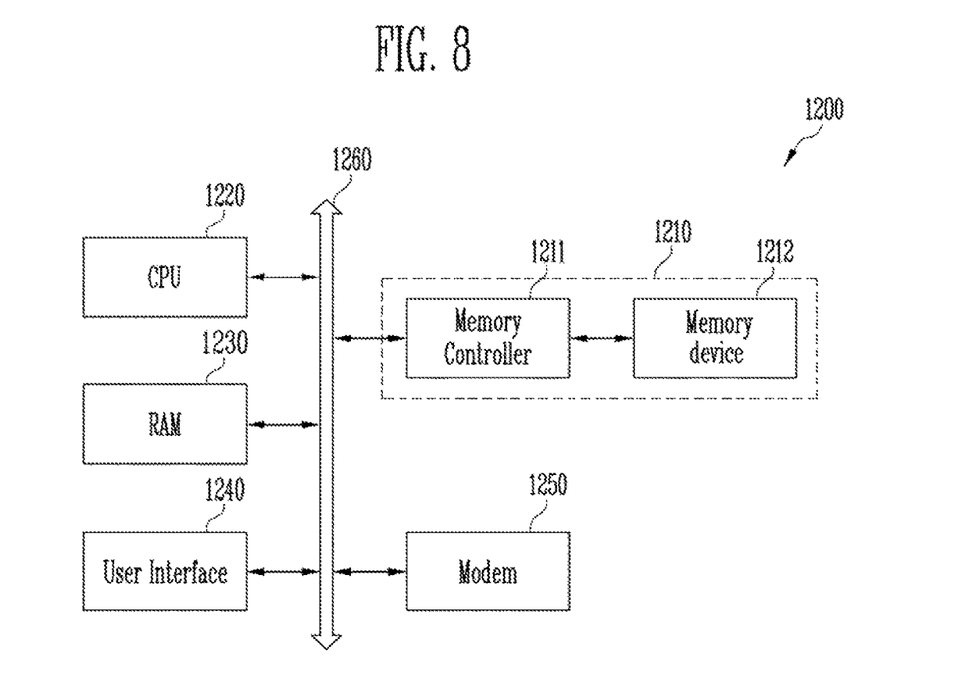
FIG. 8 is a block diagram illustrating a computing system according to an embodiment of the present disclosure.

FIG. 8 is a block diagram illustrating a computing system according to an embodiment of the present disclosure. Referring to FIG. 8, the computing system 1200 according to the embodiment of the present disclosure may include a CPU 1220, an RAM (Random Access Memory) 1230, a user interface 1240, a modem 1250, and a memory system 1210 that are electrically coupled to a system bus 1260. Furthermore, if the computing system 1200 is a mobile device, it may further include a battery for supplying operating voltage to the computing system 1200. An application chip set, a camera image processor CIS, a mobile DRAM and the like may be further included. As described above with reference to FIG. 7, the memory system 1210 may be configured by the memory device 1212 and the memory controller 1211.

Example embodiments have been disclosed herein, and although specific terms are employed, the terms are used and are to be interpreted in a generic and descriptive sense only and not for purpose of limitation. Further, it will be understood by those of skill in the art that various changes in form and details may be made without departing from the spirit and scope of the present invention as set forth in the following claims.

What is claimed is:

1. A semiconductor device comprising:
a lower conductive pattern;
a lower memory string conductive pattern disposed over the lower conductive pattern;
a stack of upper memory string conductive patterns, wherein the stack is disposed over the lower memory string conductive pattern;
a lower pad pattern extending from the lower memory string conductive pattern;
upper pad patterns respectively extending from the upper memory string conductive patterns;
a floating conductive pattern disposed under below the lower pad pattern, the floating conductive pattern overlapping the lower pad pattern; and
a contact plug coming into contact with the lower pad pattern and overlapping the floating conductive pattern.

2. The semiconductor device according to claim 1, wherein the lower conductive pattern and the floating conductive pattern are disposed at the same level and insulated from each other by a separation insulating layer.

3. The semiconductor device according to claim 2, wherein the separation insulating layer has a closed-loop shape and surrounds the floating conductive pattern.

4. The semiconductor device according to claim 2, further comprising:
a slit formed to pass through the lower pad pattern and the upper pad patterns and not overlapped with the separation insulating layer.

5. The semiconductor device according to claim 1, wherein the floating conductive pattern further extends under the stack of upper memory string conductive patterns so that the floating conductive pattern overlaps one or more of the upper pad patterns.

6. The semiconductor device according to claim 1, wherein a thickness of the lower pad pattern is smaller than any of the upper pad patterns.

7. A semiconductor device comprising:
a pipe gate;
a pipe channel layer embedded in the pipe gate;
a drain side channel layer and a source side channel layer extending from the pipe channel layer;
drain side word lines surrounding the drain side channel layer and stacked on top of one another spaced apart from each other;
source side word lines surrounding the source side channel layer and stacked on top of one another spaced apart from each other;
pad patterns extending from respective one ends of the drain side word lines or the source side word lines and forming a stepped structure;
a floating conductive pattern disposed below a first pad pattern that is most adjacent to the pipe gate, among the pad patterns, the floating conductive pattern overlapping the first pad pattern; and
a contact plug contacting the first pad pattern and extending in a direction in which the drain side channel layer and the source side channel layer extend, the contact plug overlapping the floating conductive pattern.

8. The semiconductor device according to claim 7, wherein the pipe gate and the floating conductive pattern are disposed at an identical layer and separated from each other by a separation insulating layer.

9. The semiconductor device according to claim 7, further comprising:
a drive circuit gate pattern spaced apart from the pipe gate and the floating conductive pattern.

10. The semiconductor device according to claim 9, wherein the pipe gate, the floating conductive pattern and the drive circuit gate pattern are disposed at an identical layer and separated from each other by a separation insulating layer.

11. The semiconductor device according to claim 7, wherein a thickness of the first pad pattern is smallest among the pad patterns.

12. The semiconductor device according to claim 7, wherein a thickness of each of the pad patterns is greater than a thickness of each of the drain side word lines and the source side word lines.

13. A semiconductor device comprising:
a source line;
a channel layer coupled to the source line;
a source select line surrounding the channel layer;
word lines disposed over the source select line and stacked spaced apart from each other in a direction in which the channel layer extends, the word lines surrounding the channel layer;
a first pad pattern extending from one end of the source select line;
upper pad patterns extending from respective one ends of the word lines and forming a stepped structure, the upper pad patterns formed such that the first pad pattern is exposed;
a floating conductive pattern disposed below the first pad pattern and overlapping the first pad pattern; and
a contact plug contacting the first pad pattern and extending in a direction in which the channel layer extends, the contact plug overlapping the floating conductive pattern.

14. The semiconductor device according to claim 13, wherein the source line and the floating conductive pattern are disposed at an identical layer and separated from each other by a separation insulating layer.

15. The semiconductor device according to claim 13, further comprising:
a drive circuit gate pattern spaced apart from the source line and the floating conductive pattern.

16. The semiconductor device according to claim 15, wherein the source line, the floating conductive pattern and the drive circuit gate pattern are disposed at an identical layer and separated from each other by a separation insulating layer.

17. The semiconductor device according to claim 13, wherein a thickness of the first pad pattern is smaller than a thickness of each of the upper pad patterns.

18. The semiconductor device according to claim 13, wherein a thickness of each of the first pad pattern and the upper pad patterns is greater than a thickness of each of the source select line and the word lines.

19. The semiconductor device according to claim 13, wherein the source line contacts a bottom of the channel layer.

20. The semiconductor device according to claim 13, wherein the source line comprises:
a first source layer surrounding a bottom of the channel layer; and
a second source layer disposed over the first source layer and contacting a side surface of the channel layer.

* * * * *